United States Patent
Kim et al.

(10) Patent No.: US 10,320,593 B2
(45) Date of Patent: Jun. 11, 2019

(54) RECEIVER FOR DATA COMMUNICATION

(71) Applicants: SK hynix Inc., Gyeonggi-do (KR); KOREA UNIVERSITY RESEARCH AND BUSINESS FOUNDATION, Seoul (KR)

(72) Inventors: Chul Woo Kim, Seoul (KR); Sung Jun Moon, Seoul (KR); Sang Su Lee, Seoul (KR)

(73) Assignees: SK hynix Inc., Gyeonggi-do (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 85 days.

(21) Appl. No.: 15/482,500

(22) Filed: Apr. 7, 2017

(65) Prior Publication Data
US 2018/0159552 A1    Jun. 7, 2018

(30) Foreign Application Priority Data
Dec. 7, 2016 (KR) .................. 10-2016-0165526

(51) Int. Cl.
*H04L 25/14* (2006.01)
*H04L 1/00* (2006.01)
*G06F 3/06* (2006.01)
*H03K 19/177* (2006.01)

(52) U.S. Cl.
CPC ............ *H04L 25/14* (2013.01); *G06F 3/0659* (2013.01); *H03K 19/17744* (2013.01); *H04L 1/004* (2013.01)

(58) Field of Classification Search
CPC ....................................................... H04L 25/14
See application file for complete search history.

(56) References Cited

U.S. PATENT DOCUMENTS

| 6,700,942 | B1 * | 3/2004 | Lai | H04L 25/14 375/354 |
| 7,366,267 | B1 * | 4/2008 | Lee | H03K 5/135 341/100 |
| 8,238,452 | B1 * | 8/2012 | Sarmah | H04L 25/14 375/259 |
| 8,627,189 | B2 * | 1/2014 | Tan | H03M 13/41 714/792 |
| 9,148,198 | B1 | 9/2015 | Zhang et al. | |
| 2005/0069031 | A1 * | 3/2005 | Sunter | H04L 1/205 375/224 |

(Continued)

*Primary Examiner* — Steve N Nguyen
(74) *Attorney, Agent, or Firm* — IP & T Group LLP

(57) ABSTRACT

A receiver for data communication may include: an input buffer suitable for generating plural comparison signals by differentially comparing plural input signals; a de-serializer suitable for generating plural groups of de-serialized signals by de-serializing the plural comparison signals at a preset de-serialization ratio; a D flip-flop suitable for generating plural delayed signals by delaying last de-serialized signals of the respective plural groups of de-serialized signals by a preset time; a symbol decoder suitable for comparing current and previous states of the plural comparison signals and for generating plural symbol signals based on a preset state diagram defining a correspondence relationship between the plural symbol signals and changes between current and previous states of the plural comparison signals.

15 Claims, 2 Drawing Sheets

(56) References Cited

U.S. PATENT DOCUMENTS

| | | | |
|---|---|---|---|
| 2008/0192814 A1* | 8/2008 | Hafed | G01R 31/31711 375/224 |
| 2013/0030767 A1* | 1/2013 | Li | G09G 5/006 702/186 |
| 2014/0348214 A1* | 11/2014 | Sengoku | H04L 7/04 375/147 |
| 2015/0098537 A1* | 4/2015 | Sengoku | H04L 7/0087 375/355 |
| 2015/0098538 A1* | 4/2015 | Wiley | H04L 1/205 375/355 |
| 2015/0195211 A1* | 7/2015 | Sengoku | H04L 47/34 375/222 |
| 2016/0116936 A1* | 4/2016 | Jeong | G06F 1/08 713/503 |
| 2016/0226734 A1 | 8/2016 | Pandey et al. | |
| 2018/0027174 A1* | 1/2018 | Sengoku | H04N 5/23209 348/207.11 |
| 2018/0131503 A1* | 5/2018 | Duan | H04L 7/0012 |

* cited by examiner

RECEIVER FOR DATA COMMUNICATION

CROSS-REFERENCE TO RELATED APPLICATIONS

The present application claims priority of Korean Patent Application No. 10-2016-0165526, filed on Dec. 7, 2016, which is incorporated herein by reference in its entirety.

BACKGROUND

1. Field

Exemplary embodiments of the present invention relate to a communication technology and, more particularly, to a receiver for data communication compatible with the Mobile Industry Processor Interface (MIPI).

2. Description of the Related Art

The MIPI defines a standardized interface between devices constituting a mobile device. The MIPI may be divided into a physical layer and a protocol layer, and the physical layer may include C-PHY, D-PHY and M-PHY. The physical layer C-PHY uses three channels in order to transmit/receive data between devices.

A C-PHY receiver includes a symbol decoder and a de-mapper. Since the symbol decoder and the de-mapper operate according to a table defining a relationship between an output and an input according to the physical layer C-PHY of MIPI, the receiver has difficulties in performing a full-rate operation for the physical layer C-PHY. Thus, the receiver cannot be fully-custom designed and exhibits low efficiency for the physical layer C-PHY. Therefore, there is demand for a semi-custom design for the C-PHY receiver.

RELATED ART DOCUMENT

Patent Document

U.S. Pat. No. 9,148,198 (Oct. 29, 2015)
US Patent Publication No. 2016-0226734 (Aug. 4, 2016)

SUMMARY

Various embodiments are directed to an improved receiver for data communication.

In an embodiment, a receiver for data communication may include: an input buffer suitable for generating plural comparison signals by differentially comparing plural input signals; a de-serializer suitable for generating plural groups of de-serialized signals by de-serializing the plural comparison signals at a preset de-serialization ratio; a D flip-flop suitable for generating plural delayed signals by delaying last de-serialized signals of the respective plural groups of de-serialized signals by a preset time; a symbol decoder suitable for comparing current and previous states of the plural comparison signals and for generating plural symbol signals based on a preset state diagram defining a correspondence relationship between the plural symbol signals and changes between current and previous states of the plural comparison signals.

The input buffer and the de-serializer may be driven at a full rate, and the D flip-flop and the symbol decoder may be driven at a speed obtained by dividing the full rate by the preset de-serialization ratio.

The symbol decoder may decode the first to third symbol signals at a cycle set to the preset time.

The preset time may correspond to the length of each of successive symbols encoded by a transmitter.

The symbol decoder may include symbol decoders of which the number corresponds to the de-serialization ratio of the de-serializer.

The receiver may further include a de-mapper suitable for generating data signals corresponding to the first to third symbol signals, based on a preset table. The de-mapper may be driven at a speed obtained by dividing the full rate by the preset de-serialization ratio.

The receiver may further include a clock data recovery circuit suitable for recovering a clock signal in response to transitions of the first to third comparison signals. The de-serializer may provide the first to third signals to the symbol decoder, the first to third signals being obtained by de-serializing the first to third comparison signals in response to the recovered clock signal, and the D flip-flop may delay the last bits of the first to third signals by the preset time in response to the recovered clock signal, and provide the delayed first to third bit signals to the symbol decoder.

The transitions of the first to third comparison signals may correspond to the boundaries between symbols encoded by a transmitter.

In an embodiment, a receiver for data communication may include: an input buffer suitable for generating plural comparison signals by differentially comparing plural input signals transmitted from a transmitter through multiple channels; a clock data recovery circuit suitable for recovering a clock signal according to transitions of the plural comparison signals; a de-serializer suitable for generating plural groups of de-serialized signals by de-serializing the plural comparison signals at a preset de-serialization ratio in response to the recovered clock signal; a D flip-flop suitable for generating plural delayed signals by delaying last de-serialized signals of the respective plural groups by a preset time in synchronization to the recovered clock signal; and a symbol decoder suitable for comparing current and previous ones included in the plural delayed signals of previous input signals and the de-serialized signals in the plural groups of current input signals, and generating plural symbol signals based on a preset state diagram defining correspondence relationship between the plural symbol signals and changes between current and previous states of the plural comparison signals.

The input buffer, the clock data recovery circuit and the de-serializer may be driven at a full rate, and the D flip-flop and the symbol decoder may be driven at a speed obtained by dividing the full rate by the preset de-serialization ratio.

The symbol decoder may include symbol decoders of which the number corresponds to the de-serialization ratio of the de-serializer.

The transitions of the first to third comparison signals may correspond to the boundaries between symbols encoded by the transmitter.

The symbol decoder may decode the first to third symbol signals at a cycle set to the preset time.

The preset time may correspond to the length of each of successive symbols encoded by the transmitter.

The receiver may further include a de-mapper suitable for generating data signals corresponding to the first to third symbol signals based on a preset table.

According to embodiments of the invention, since the symbol decoder and the de-mapper which are designed through coding and compositing in Verilog are operated at low speed, the semi-custom design is allowed.

Since embodiments of the invention allow the semi-custom design, the power consumption and circuit complexity can be reduced, and the speed limit can be significantly lowered.

Furthermore, embodiments of the invention can be usefully applied even when the full-rate speed rises with the development of the data communication technology.

DETAILED DESCRIPTION

Figure 1:
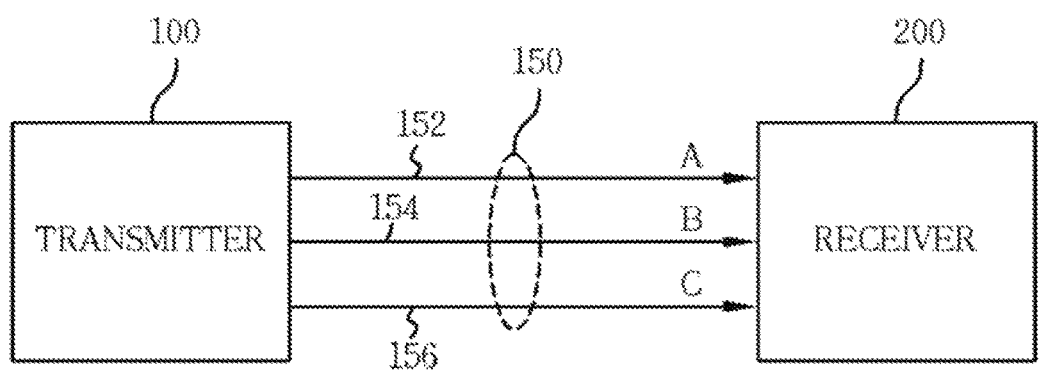
FIG. 1 is a block diagram illustrating a configuration of a physical layer C-PHY of the MIPI.

Various embodiments will be described below in more detail with reference to the accompanying drawings such that this disclosure will be thorough and complete, and will fully convey the scope of the present invention to those skilled in the art. Throughout the disclosure, like reference numerals refer to like parts throughout the various figures and embodiments of the present invention.

Moreover, detailed descriptions related to publicly known functions or configurations will be ruled out in order not to unnecessarily obscure subject matters of the present invention.

The terms such as first and second may be used to describe various components, but the components are not limited by the terms, and the terms are used only to distinguish one component from another component.

FIG. 1 is a block diagram illustrating a configuration of a physical layer C-PHY of the Mobile Industry Processor Interface (MIPI), Referring to FIG. 1, the physical layer C-PHY may include a transmitter 100 and a receiver 200 exchanging data and control information through a communication link 150 including three channels 152, 154 and 156. The physical layer C-PHY of the MIPI defines a physical layer interface for transmitting/receiving data and control information through the three channels 152, 154 and 156 between an application processor and devices for supporting a camera, display and the like in a mobile device.

The three channels 152, 154 and 156 may be configured to transmit data encoded at a high-speed digital interface, the data having three phases and polarity (hereafter, referred to as 3-phase polarity data). The 3-phase polarity data can indicate six possible signal states through combinations of three phases and two polarities.

The transmitter 100 generates symbols by encoding 3-phase polarity data, and transmits the generated symbols to the receiver 200 through the channels 152, 154 and 156, and the receiver 200 decodes the symbols received from the transmitter 100.

The transmitter 100 may transmit the symbols indicating signal states including a non-driven state, a positive driven state and a negative driven state. For example, the positive driven state and the negative driven state may be indicated by a voltage difference between two channels among the channels 152, 154 and 156, and the non-driven state may be indicated by a high-impedance of the channels 152, 154 and 156.

Here, the signal states can be expressed with {+1, 0, −1}. For example, three signal states {+1, 0, −1} may be represented by a set of three voltage levels +V, 0 and −V, a set of three voltage levels +V, +V/2 and 0, or a set of three currents I, 0 and −I.

The receiver 200 extracts the sequences of the symbols from signals received through the channels 152, 154 and 156. For example, the receiver 200 decodes the symbols based on the signal state expressed as a combination of polarities and phase rotations of the signals received through the channels 152, 154 and 156, and generate a data signal to provide to a peripheral device of the mobile device based on the decoded symbols. The receiver 200 may be configured as follows.

Figure 2:
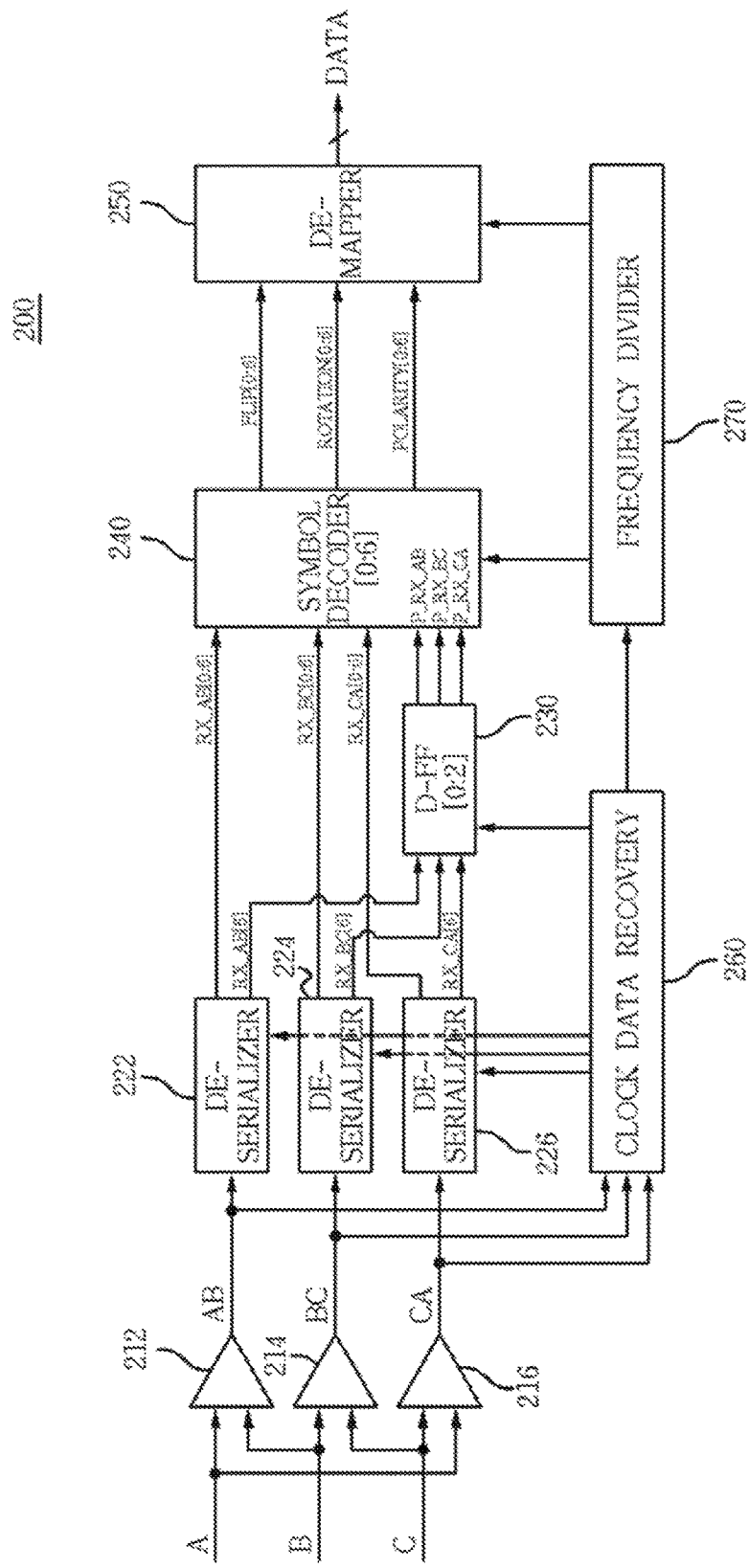
FIG. 2 is a block diagram illustrating a receiver for the physical layer C-PHY in accordance with an embodiment of the present invention.

FIG. 2 is a block diagram illustrating the receiver 2 for the physical layer C-PHY in accordance with an embodiment.

Referring to FIG. 2, the receiver 200 in accordance with the present embodiment includes input buffers 212, 214 and 216, de-serializers 222, 224 and 226, a D flip-flop 230 a symbol decoder 240, a de-mapper 250, a clock data recovery circuit 260 and a frequency divider 270.

The symbol decoder 240 and the de-mapper 250 are difficult to design through a full-custom design and are inefficient because the symbol decoder 240 and the de-mapper 250 operate according to a predetermined state diagram defining a relationship between an output and an input. Therefore, the symbol decoder 240 and the de-mapper 250 require the semi-custom design which models logic blocks. The semi-custom design may be made by using a system design tool such as a hardware description language (HDL) including coding and compositing in Verilog. The semi-custom design has a lower operation speed than the full-custom design. The present embodiment provides the receiver 200 having the symbol decoder 240 which can be implemented through the semi-custom design.

For this configuration, the symbol decoder 240 is arranged at a rear stage of the de-serializers 222, 224 and 226. Thus, the operation speed of the symbol decoder 240 can be lowered for the semi-custom design of the symbol decoder 240.

The structure of the receiver 200 in accordance with the present embodiment will be described in detail as follows.

First to third input buffers 212, 214 and 216 corresponding to the three channels 152, 154 and 156 receive first to third input signals A, B and C provided from the transmitter 100 and output first to third comparison signals AB, BC and CA, respectively. The first input buffer 212 generates the first comparison signal AB by differentially comparing the first and second input signals A and B, and provides the comparison signal AB to the de-serializer 222. The second input buffer 214 generates the second comparison signal BC by differentially comparing the second and third input signals B and C, and provides the comparison signal BC to the de-serializer 224. The third input buffer 216 generates the third comparison signal CA by differentially comparing the third and first input signals C and A, and provides the comparison signal CA to the de-serializer 226.

For example, when the signal states of the input signals A, B and C are (+1, −1, 0), the first comparison signal AB is calculated as +2 through a subtraction (A−B) between the first and second input signals A and B, the second comparison signal BC is calculated as −1 through a subtraction (B−C) between the second and third input signals B and C, and the third comparison signal CA is calculated as +1 through a subtraction (C−A) between the third and first input signals C and A. As such, five possible levels of −2, −1, 0, +1 and +2 of the first to third comparison signals AB, BC and CA may be calculated by the first to third input buffers 212, 214 and 216 based on the input signals A, B and C.

The first to third input buffers 212, 214 and 216 provide the first to third comparison signals AB, BC and CA to the clock data recovery circuit 260 as well as to the de-serializers 222, 224 and 226.

The clock data recovery circuit 260 recovers a clock signal based on transitions of the first to third comparison signals AB, BC and A. The clock data recovery circuit 260 may include a clock circuit (not illustrated) and a signal state change detection circuit (not illustrated) for detecting the transitions of the first to third comparison signals AB, BC and A. The frequency divider 270 divides the clock signal recovered by the clock data recovery circuit 260, and provides the divided clock signal to the symbol decoder 240 and the de-mapper 250. The transitions of the first to third comparison signals AB, BC and CA may be understood as the boundaries between successive symbols encoded by the transmitter 100.

The de-serializers 222, 224 and 226 provide first to third signals RX_AB[0:6] RX_BC[0:6] and RX_CA[0:6] to the D flip-flop 230 and the symbol decoder 240. The de-serializers 222, 224 and 226 generate the first to third signals RX_AB[0:6], RX_BC[0:6] and RX_CA[0:6] by de-serializing the first to third comparison signals AB, BC and CA of the corresponding input buffers 212, 214 and 216. For example, the de-serializers 222, 224 and 226 may output the first to third signals RX_AB[0:6], RX_BC[0:6] and RX_CA[0:6] which are de-serialized at a de-serialization ratio of 1:7 by synchronizing the first to third comparison signals AB, BC and CA, which are inputted as sequences, to the clock signal recovered by the clock data recovery circuit 260.

The D flip-flop 230 delays last data RX_AB[6], RX_BC[6] and RX_CA[6] of the first to third signals RX_AB[0:6], RX_BC[0:6] and RX_CA[0:6] by a preset time in response to the recovered clock signal, and provides the delayed last data P_RX_AB, P_RX_BC and P_RX_CA to the symbol decoder 240. For example, since the D flip-flop 230 is located at a rear stage of the de-serializers 222, 224 and 226, a high-speed flip flop does not need to be used, and the de-serializers 222, 224 and 226 serve to generate a previous data of current first to third signals RX_AB[0:6], RX_BC[0:6] and RX_CA[0:6]. Thus, the D flip-flop 230 may include three flip flops for generating the previous data (i.e., the delayed last data P_RX_AB, P_RX_BC and P_RX_CA of previous first to third signals RX_AB[0:6], RX_BC[0:6] and RX_CA[0:6]) of first data RX___AB[0], RX_BC[0] and RX_CA[0] of current first to third signals RX_AB[0:6], RX_BC[0:6] and RX_CA[0:6]. Here, the preset time may be understood as the length of each of the successive symbols encoded by the transmitter 100, and the delayed last data P_RX_AB, P_RX_BC and P_RX_CA of previous first to third signals RX_AB[0:6], RX_BC[0:6] and RX_CA[0 6] outputted from the three D flip-flops may be understood as the previous data of the first data RX_AB[0], RX_BC[0] and RX_CA[0] of current first to third signals RX_AB[0:6], RX_BC[0:6] and RX_CA[0:6].

The symbol decoder 240 receives the first to third signals RX_AB[0:6], RX_BC[0:6] and RX_CA[0:6] provided from the de-serializers 222, 224 and 226 and the delayed first to third bit signals P_RX_AB, P_RX_BC and P_RX_CA provided from the D flip-flop 230, and generates first to third symbol signals FLIP[0:6], ROTATION[0:6] and POLARITY[0:6] from the preset state diagram representing changes of the current and previous states of the first to third signals RX_AB[0:6], RX_BC[0:6] and RX_CA[0:6]. The symbol decoder 240 may include seven symbol decoding units when the de-serializers 222, 224 and 226 de-serialize signals at a de-serialization ratio of 1:7. The first data RX_AB[0], RX_BC[0] and RX_CA[0] may be understood as the previous data of the second data RX_AB[1], RX_BC[1] and RX_CA[1], the second data RX_AB[1], RX_BC[1] and RX_CA[1] may be understood as the previous data of the third data RX_AB[2], RX_BC[2] and RX_CA[2], and the delayed last data P_RX_AB, P_RX_BC and P_RX_CA of previous first to third signals RX_AB[0:6], RX_BC[0:6] and RX_CA[0:6] may be understood as the previous data of the first data RX_AB[0], RX_BC[0] and RX_CA[0] of current first to third signals RX_AB[0:6], RX_BC[0:6] and RX_CA[0:6].

As such, the symbol decoder 240 generates first to third symbol signals FLIP[0:6] ROTATION[0:6] and POLARITY[0:6] from the preset state diagram representing changes of the current and previous states of the first to third signals RX_AB[0:6], RX_BC[0:6] and RX_CA[0:6] by comparing the current states with the previous states of the first to third signals RX_AB[0:6], RX_BC[0:6] and RX_CA[0:6]. The first to third symbol signals FLIP[0:6], ROTATION[0:6] and POLARITY[0:6] may be understood as signals indicating the phases, rotations and polarities of successive symbols encoded by the transmitter 100. Since the symbol decoder 240 is located at the rear stage of the de-serializers 222, 224 and 226 which de-serialize signals at a de-serialization ratio of 1:7, seven symbol decoding units may be required. However, the symbol decoder 240 may be operated at an operation speed which is lowered sevenfold. Thus, the symbol decoder 240 can be designed through a semi-custom design.

Since the receiver 200 in accordance with the present embodiment can lower the operation speed of the symbol decoder 240, the receiver 200 can be implemented through the semi-custom design of the symbol decoder, reduce the power consumption and circuit complexity, and significantly lower the speed limit.

The de-mapper 250 generates data signals DATA corresponding to the first to third symbol signals FLIP[0:6], ROTATION[0:6] and POLARITY[0:6] based on the preset table. For example, the de-mapper 250 receives 21 first to third symbol signals FLIP[0:6], ROTATION[0:6] and POLARITY[0:6], and generates a 16-bit data signal corresponding to the first to third symbol signals FLIP[0:6], ROTATION[0:6] and POLARITY[0:6] through the preset table. The data signal DATA may be provided to a display device or camera device of a mobile device.

In the receiver 200 in accordance with the present embodiment, the input buffers 212, 214 and 216 and the de-serializers 222, 224 and 226 can be driven at full rate, and the D flip-flop 230, the symbol decoder 240 and the de-mapper 250 can be driven at a speed lowered by the de-serialization ratio of the de-serializers 222, 224 and 226. Thus, the symbol decoder 240 and the de-mapper 250 can be designed through the semi-custom design.

For example, when the operation speed corresponding to the full rate is 2.5 Gbps, signals passing through the de-serializers 222, 224 and 226 which de-serialize signals at a de-serialization ratio of 1:7 are processed at a speed seven times lower than 2.5 Gbps. Thus, the symbol decoder 240 and the de-mapper 250 are operated at a maximum speed of 357.14 Mbps (=2.5 Gbps/7). Hence, the configuration of the receiver 200 in accordance with the present embodiment supports the symbol decoder 240 and the de-mapper 250 to operate at low speed, the symbol decoder 240 and the de-mapper 250 being designed through the semi-custom design.

As such, the symbol decoder 240 and the de-mapper 250 which are designed through the semi-custom design are operated at low speed.

Since the receiver in accordance with the present embodiment is implemented through the semi-custom design, power consumption and circuit complexity can be reduced, and the speed can be significantly improved.

Furthermore, the receiver in accordance with the present embodiment can be usefully applied even when the full-rate speed rises with the development of the data communication technology.

In the present disclosure, the receiver receives 3-phase and polarity data through the three channels according to physical layer C-PHY of the MIPI. However, the receiver can be configured to receive multi-phase and polarity data through multiple channels.

Although various, embodiments have been described for illustrative purposes, it will be apparent to those skilled in the art that various changes and modifications may be made without departing from the spirit and scope of the invention as defined in the following claims.

What is claimed is:

1. A receiver for data communication, comprising:
an input buffer suitable for generating plural comparison signals by differentially comparing plural input signals;
a de-serializer suitable for generating plural groups of de-serialized signals by de-serializing the plural comparison signals at a preset de-serialization ratio;
a D flip-flop suitable for generating plural delayed signals by delaying last de-serialized signal of each of the plural groups of de-serialized signals by a preset time; and
a symbol decoder suitable for comparing current and previous states of the plural comparison signals and for generating plural symbol signals based on a preset state diagram defining a correspondence relationship between the plural symbol signals and changes between current and previous states of the plural comparison signals,
wherein the input buffer and the de-serializer operate at a full rate, and
wherein the D flip-flop and the symbol decoder operate at a rate lower than the full rate by the preset de-serialization ratio.

2. The receiver of claim 1 wherein the input buffer receives first to third input signals, and generates first to third comparison signals by differentially comparing the first and second signals, differentially comparing the second and third signals, and differentially comparing the third and first signals, respectively;
the de-serializer generates first to third groups of de-serialized signals by de-serializing the first to third comparison signals at the preset de-serialization ratio;
the D flip-flop generates first to third delayed signals by delaying the last de-serialized signal of each of the first to third groups of de-serialized signals by the preset time; and
the symbol decoder receives the first to third signals provided from the de-serializer and the delayed first to third signals provided from the D flip-flop, and generates first to third symbol signals corresponding to changes of current and previous states of the first to third comparison signals based on the preset state diagram.

3. The receiver of claim 1, wherein the symbol decoder generates the plural symbol signals at a preset period.

4. The receiver of claim 3, wherein the preset period corresponds to a length of each of successive symbols encoded by a transmitter and corresponding to the input signals.

5. The receiver of claim 1, wherein the symbol decoder includes plural decoding units, a number of which corresponds to the de-serialization ratio of the de-serializer.

6. The receiver of claim 1,
further comprising a de-mapper suitable for generating data signals based on a preset table defining correspondence relationship between the data signals and the plural symbol signals,
wherein the de-mapper is driven at the rate lower than the full rate by the preset de-serialization ratio.

7. The receiver of claim 1,
further comprising a clock data recovery circuit suitable for recovering a clock signal according to transitions of the plural comparison signals,
wherein each of the de-serializer and the D flip-flop operates in synchronization to the recovered clock signal.

8. The receiver of claim 7, wherein the transitions of the plural comparison signals correspond to the boundaries between symbols encoded by a transmitter and corresponding to the input signals.

9. A receiver for data communication, comprising:
an input buffer suitable for generating plural comparison signals by differentially comparing plural input signals transmitted from a transmitter through multiple channels;
a clock data recovery circuit suitable for recovering a clock signal according to transitions of the plural comparison signals;
a de-serializer suitable for generating plural groups of de-serialized signals by de-serializing the plural comparison signals at a preset de-serialization ratio in response to the recovered clock signal;
a D flip-flop suitable for generating plural delayed signals by delaying last de-serialized signal of each of the plural groups by a preset time in synchronization to the recovered clock signal; and
a symbol decoder suitable for comparing current and previous ones included in the plural delayed signals of previous input signals and the de-serialized signals in the plural groups of current input signals, and generating plural symbol signals based on a preset state diagram defining correspondence relationship between the plural symbol signals and changes between current and previous states of the plural comparison signals,
wherein the input buffer, the clock data recovery circuit and the de-serializer operate at a full rate, and
wherein the D flip-flop and the symbol decoder operate at a rate lower than the full rate by the preset de-serialization ratio.

10. The receiver of claim 9, wherein,
the input buffer differentially compares first to third input signals corresponding to first to third channels coupled to the transmitter, and generates first to third comparison signals;
the clock data recovery circuit recovers the clock signal in response to transitions of the first to third comparison signals;
the de-serializer generates first to third groups of de-serialized signals by de-serializing the first to third comparison signals at the preset de-serialization ratio in synchronization to the clock signal;

the D flip-flop delays the last de-serialized signal of each of the first to third signals by the preset time in response to the clock signal, and outputting the delayed first to third bit signals; and the symbol decoder receives the first to third signals provided from the de-serializer and the delayed first to third signals provided from the D flip-flop, and generates first to third symbol signals corresponding to changes of current and previous states of the first to third signals based on the preset state diagram.

11. The receiver of claim 9, wherein the symbol decoder includes plural decoding units, a number of which corresponds to the de-serialization ratio of the de-serializer.

12. The receiver of claim 9, wherein the transitions of the plural comparison signals correspond to the boundaries between symbols encoded by the transmitter and corresponding to the input signals.

13. The receiver of claim 9, wherein the symbol decoder generates the plural symbol signals at a preset period.

14. The receiver of claim 13, wherein the preset period corresponds to a length of each of successive symbols encoded by a transmitter and corresponding to the input signals.

15. The receiver of claim 9, further comprising a de-mapper suitable for generating data signals based on a preset table defining correspondence relationship between the data signals and the plural symbol signals.

* * * * *